United States Patent
Yadavalli et al.

(10) Patent No.: US 10,655,024 B2
(45) Date of Patent: May 19, 2020

(54) FLEXIBLE, BIODEGRADABLE, AND BIOCOMPATIBLE SUPERCAPACITORS

(71) Applicant: Virginia Commonwealth University, Richmond, VA (US)

(72) Inventors: Vamsi K. Yadavalli, Richmond, VA (US); Ramendra K. Pal, Richmond, VA (US)

(73) Assignee: Virginia Commonwealth University, Richmond, VA (US)

( * ) Notice: Subject to any disclaimer, the term of this patent is extended or adjusted under 35 U.S.C. 154(b) by 73 days.

(21) Appl. No.: 16/000,948

(22) Filed: Jun. 6, 2018

(65) Prior Publication Data

US 2018/0355194 A1 Dec. 13, 2018

Related U.S. Application Data

(60) Provisional application No. 62/517,321, filed on Jun. 9, 2017.

(51) Int. Cl.

| | | |
|---|---|---|
| *C09D 11/04* | (2006.01) | |
| *C09D 11/52* | (2014.01) | |
| *C09D 11/037* | (2014.01) | |
| *C09D 11/102* | (2014.01) | |
| *G03F 7/039* | (2006.01) | |
| *G03F 7/038* | (2006.01) | |
| *H01G 11/78* | (2013.01) | |
| *G03F 7/16* | (2006.01) | |

(Continued)

(52) U.S. Cl.
CPC ............ *C09D 11/04* (2013.01); *C09D 11/037* (2013.01); *C09D 11/102* (2013.01); *C09D 11/106* (2013.01); *C09D 11/52* (2013.01); *G03F 7/038* (2013.01); *G03F 7/039* (2013.01); *G03F 7/16* (2013.01); *G03F 7/2002* (2013.01); *G03F 7/32* (2013.01); *H01G 11/26* (2013.01); *H01G 11/36* (2013.01); *H01G 11/48* (2013.01); *H01G 11/56* (2013.01); *H01G 11/78* (2013.01); *H01G 11/86* (2013.01)

(58) Field of Classification Search
CPC ..... C09D 11/04; C09D 11/037; C09D 11/102; C09D 11/106; C09D 11/52; G03F 7/038; G03F 7/039; G03F 7/16; G03F 7/2002; G03F 7/32; H01G 11/26; H01G 11/36; H01G 11/48; H01G 11/56; H01G 11/78; H01G 11/86

See application file for complete search history.

(56) References Cited

U.S. PATENT DOCUMENTS 9,061,139 B2 * 6/2015 Stevenson .............. A61N 1/056
9,928,968 B2   3/2018 Bettinger et al.
(Continued)

OTHER PUBLICATIONS

Herbert et al. (Soft Material-Enabled, Flexible Hybrid Electronics for Medicine, Healthcare, and Human-Machine Interfaces. Materials 2018, 11, 187).

(Continued)

*Primary Examiner* — Michael P McFadden
(74) *Attorney, Agent, or Firm* — W&C IP (57) ABSTRACT

Provided herein is biodegradable supercapacitor system comprising a protein based flexible thin film substrate, patterned electrodes formed from a biocompatible conductive ink, and biocompatible gel electrolyte. Methods of making the supercapacitor system are also provided.

21 Claims, 7 Drawing Sheets

(51) Int. Cl.

| | | |
|---|---|---|
| G03F 7/32 | (2006.01) | |
| H01G 11/48 | (2013.01) | |
| H01G 11/56 | (2013.01) | |
| H01G 11/36 | (2013.01) | |
| H01G 11/86 | (2013.01) | |
| G03F 7/20 | (2006.01) | |
| C09D 11/106 | (2014.01) | |
| H01G 11/26 | (2013.01) | |

(56) References Cited

U.S. PATENT DOCUMENTS

| | | | |
|---|---|---|---|
| 9,941,522 B2 | 4/2018 | Cosnier et al. | |
| 2011/0090620 A1 | 4/2011 | Liu et al. | |
| 2013/0240251 A1 | 9/2013 | Kaplan et al. | |
| 2014/0303470 A1* | 10/2014 | Tsukada | D06P 1/38 600/377 |
| 2016/0006039 A1 | 1/2016 | Cosnier et al. | |
| 2016/0050750 A1 | 2/2016 | Rogers et al. | |
| 2016/0014566 A1 | 5/2016 | Curchoe et al. | |
| 2016/0145669 A1* | 5/2016 | Curchoe | C12Q 1/004 361/502 |
| 2017/0029607 A1 | 10/2017 | Mahajan et al. | |
| 2017/0031688 A1 | 11/2017 | Doyle et al. | |

OTHER PUBLICATIONS

Zhu et al. (Silk Fibroin for Flexible Electronic Devices. Advanced Materials, Wiley Online Library. 2016).

Rimia-Vladu, M ("Green" electronics: Biodegradable and Biocompatible Materials and Devices for Sustainable Future. Chem Soc Rev, 2014, 43:588-610).

Niajafabadi, A (Biodegradable nanofibrous polymeric substrates for generating elastic and flexible electronics. Adv Mater. 2014, 26(33):5823-5830).

Tan et al. Biodegradable Electronics: Cornerstone for Sustainable Electronics and Transient Applications. Jounal of Materials Chemistry C, Issue 24, 2016.

Wang et al. New Insights and Perspectives into Biological Materials for Flexible Electronics. Chemical Society Reviews, Issue 22, 2017.

Yu et al. Emergence of Fiber Supercapacitors. Chemical Society Reviews, Issue 3, 2015.

Pal et al. Photolithographic micropatterning of conducting polymers on flexible silk matrices, Advanced Materials 28 (7), 1406-1412, 2016.

Pal et al. Conducting polymer-silk biocomposites for flexible and biodegradable electrochemical sensors, Siosensors and Bioelectronics 81, 294-302, 2017.

Pal et al. Biosensing using photolithographically micropatterned electrodes of PEDOT: PSS on ITO substrates, Sensors and Actuators B: Chemical 242, 140-147, 2017.

Pal et al. Micropatterned conductive polymer biosensors on flexible PDMS films, Sensors and Actuators B: Chemical 259, 498-504.

* cited by examiner

FLEXIBLE, BIODEGRADABLE, AND BIOCOMPATIBLE SUPERCAPACITORS

CROSS-REFERENCE TO RELATED APPLICATIONS

This application claims the benefit of U.S. provisional patent application 62/517,321, filed Jun. 9, 2017, the complete contents of which is hereby incorporated by reference.

FIELD OF THE INVENTION

Embodiments of the invention relate to a microsupercapacitor suitable for energy storage for implantable bioelectronics and as biosensors.

BACKGROUND OF THE INVENTION

Rapid progress in the field of electronics is ushering in an era of smart and adaptable devices in diverse applications such as wearables [1], e-textiles [2], smart surfaces [3], mobile devices [4], and epidermal [5] and implanted electronics [6]. Such portable devices require optimal energy storage and supply systems to function independently [7]. An additional challenge for devices operating in biological working environments is often the need to be miniaturized and compliant, necessitated by the soft and conformal nature of the biological milieu. This has led to research in flexible lithium-ion batteries, fuel cells, and supercapacitors [8, 9]. Among these, supercapacitors (SCs) are emerging as an important class of energy storage systems due to their fast charge-discharge rate, high power density, and long cycling life [10]. Flexible SCs can be used to power miniaturized devices having low power requirement. To date, there have been significant efforts to fabricate SCs in various geometries including planar [11], fiber, and wire-shape [12] to achieve properties such as ultra-flexibility, compactness, light weight, mechanical, and electrochemical stability.

A traditional supercapacitor is primarily composed of four components: active electrode, carrier substrate, gel electrolyte, and charge collectors. To date, various active electrode materials have been identified [7, 13-15] and are usually deposited or printed on inert, flexible carrier substrates [16]. Gel electrolytes are used as electrode separators and ion conductors [17]. The electrodes are usually interfaced with metallic conductors to and for transport of charges. Even though a wide range of materials have been identified for flexible SCs, material selection for energy storage devices for in vivo, subcutaneous or deep tissue implantable operations is challenging. Such systems necessitate additional properties such as biocompatibility, biodegradability, and often, sustainable, environmentally benign processing [18]. For instance, degradable devices that can be resorbed by the body would eliminate the need for additional extractive surgery. Therefore there has been interest in the use of natural biomaterials [19, 20]. The biopolymers can provide 3D structural support to the electroactive materials such as biohydrogels [19], provide a dielectric planar support such as paper-based devices [11], be pyrolyzed to form porous carbon electrodes [21], and form gel electrolytes [19].

Important performance parameters are capacitance, charge-discharge characteristics, capacitance retention over cycling, and the ratio of energy density to power density [22]. Capacitance values can be normalized over loaded active material (mass), area, or volume of the electrode. In the above mentioned systems, the improvement in capacitance performance is largely driven by combining electrode materials and enhancement of porosity to increase active area [13, 19, 23, 24].

However, an issue with conventional SCs is that they are too large to be used in vivo [16]. A recent approach to improve performance and integration with microfabricated devices involves optimizing packaging of the electrode itself. Instead of having two planar electrodes with sandwiched gel electrolyte, an interdigitated alternating microelectrode array is used [14, 25]. Performance improvement is achieved due to a shortened diffusion path without problems of electrode short-circuiting [26]. However, bio-supercapacitors that can be manufactured with a biocompatible fabrication process and which can be integrated with miniaturized devices, are needed.

SUMMARY OF THE INVENTION

An aspect of the invention provides a biocompatible and biodegradable supercapacitor system that may be fabricated without the use of metals or organic solvents and which may use benign electrolytes. The supercapacitor may comprise a flexible protein substrate, at least two electrodes comprising a biocompatible conductive ink patterned on the flexible protein substrate, and a biocompatible gel electrolyte connecting the at least two electrodes. In some embodiments, the flexible protein substrate is a silk protein substrate. In some embodiments, the silk protein substrate is fabricated from at least one of fibroin and sericin proteins. In some embodiments, the biocompatible gel electrolyte is NaCl-agarose. In some embodiments, the biocompatible conductive ink comprises sericin protein photoresist (SPP) and poly(3,4-ethylenedioxythiophene):polystyrene sulfonate (PEDOT:PSS). In some embodiments, the conductive ink is dosed with reduced graphene oxide (rGO). In some embodiments, patterning of said biocompatible conductive ink is performed using photolithography.

Another aspect of the invention provides a biocompatible conductive ink comprising SPP, PEDOT:PSS, and rGO.

Another aspect of the invention provides a method for fabricating a biodegradable supercapacitor, comprising the steps of patterning electrodes on a flexible protein substrate with a biocompatible conductive ink and interconnecting the electrodes with a biocompatible gel electrolyte. In some embodiments, the method further comprises preparing the flexible protein substrate and forming the biocompatible conductive ink. In some embodiments, the flexible protein substrate is a silk protein substrate. In some embodiments, the silk protein substrate is fabricated from at least one of fibroin and sericin proteins. In some embodiments, the conductive ink comprises SPP and PEDOT:PSS. In some embodiments, the conductive ink is dosed with rGO in the forming step. In some embodiments, the biocompatible gel electrolyte is NaCl-agarose. In some embodiments, the patterning step is performed using photolithography. In some embodiments, the method is a water-based process carried out at room temperature.

DETAILED DESCRIPTION

We recently demonstrated a sustainable approach to micropatterning electroactive, conductive poly(3,4-ethylenedioxythiophene):polystyrene sulfonate (PEDOT:PSS) by forming composites with chemically-modified photo-crosslinkable silk proteins [27]. This conductive composite ink has a high charge storage capacity, can be micropatterned into circuits using photolithography, and can function without the use of a conductive metal/metal oxide background [28].

Embodiments of the disclosure provide a supercapacitor (SC), comprising a flexible protein substrate, at least two electrodes comprising a biocompatible conductive ink patterned on the flexible substrate, and a biocompatible gel electrolyte connecting the at least two electrodes. The SC systems described herein may be biodegradable (i.e. transient), biocompatible, and microfabricated having protein-based composites that may be used for wearable and physiologically implantable bioelectronics applications, e.g. as biosensors, biodetectors, and/or for energy storage. These miniaturized devices may be fabricated using a facile, room temperature approach using only water as the solvent. Via the doping of very small amounts of reduced graphene oxide (rGO) with the conductive ink, a tunable increase in the capacitive nature of the organic electrodes may be effected. The high mechanical flexibility, strength, optical transparency, biocompatibility and biodegradability of the support biopolymer makes this a versatile material for SCs. In addition, the SCs may use a gel electrolyte to form a benign, completely biomaterial based, biocompatible micro-supercapacitor system that can be used in a biological microenvironment. Such a system is lightweight and flexible, while being mechanically stable in aqueous environments. Further, the SC itself may have a high specific capacitance, cycling stability, and fast charge rate.

The dimensions of the substrate may be on the order of 1 μm to 1 cm or larger. In some aspects of the disclosure, the flexible substrate may comprise a natural (i.e. non-synthetic) protein substrate such as a silk protein substrate. For example, a silk protein substrate may be fabricated from at least one of fibroin and sericin proteins. Silk is biocompatible, FDA-approved, optically transparent, mechanically robust (high mechanical modulus and toughness), and flexible in thin film form. It is also compatible with aqueous processing, which preserves sensitive electronic functions, and amenable to chemical and biological functionalization. Suitable extraction and purification techniques of silk fibroin or sericin from, for example, Bombyx mori silkworm cocoons are well known in the art. Other silkworm sources can also be used, including non-mulberry silkworm from the species Antheraea mylitta. Purified protein may also be obtained from commercial vendors, e.g. purified sericin may be purchased from Wako Chemicals USA, Richmond, Va.

Other proteins that may be used in the flexible substrate include but are not limited to chitosan, collagen, gelatin, agarose, chitin, polyhydroxyalkanoates, starch (amylose amylopectin), cellulose, hyaluronic acid, pectin, agar, alginate, sodium alginate, pullulan, xanthan gum, tragacanth gum, guar gum, acacia gum, gum arabic, gum karaya, levan, elsinan, zein, casein, soluble derivatives of natural polymers such as cellulose derivatives HMPC, protein from egg white (albumin), or any combination of thereof.

The term flexible relates to a material having a low Young's modulus, e.g., a modulus less than or equal to 100 MPa, less than or equal to 10 MPa, or less than or equal to 2 MPa or a modulus selected from the range of 0.1 MPa to 50 MPa. The Young's modulus range may differ for other biopolymers. These moduli may be tuned by controlling the degree of crosslinking of the proteins.

The term biocompatible relates to a material or device that can carry out its intended function in a biological system without having toxic or injurious effects on the biological system.

The term biodegradable (or bioresorbable) relates to a material that is generally organic and can be disintegrated by biological means. In some embodiments, the device described herein may be completely biodegraded, for example, in less than one year, less than 90 days, or less than 1 month making it a suitable choice for an implant and forget kind of system. Bioresorbable medical devices that degrade and are cleared from the body avoid toxicity and inflammation and the need for additional extractive surgery.

In some embodiments, the SC or system containing the SC is completely free of metal or metal oxides.

Embodiments of the disclosure provide a biocompatible conductive ink that may be used to form electrodes on a flexible substrate. In some embodiments, the conductive ink comprises sericin protein photoresist (SPP) as the carrier and poly(3,4-ethylenedioxythiophene):polystyrene sulfonate (PEDOT:PSS) as the conductive polymer. Other suitable carriers include, but are not limited to fibroin protein photoresist, PEGDA, egg white (albumin), trimethylsilyl cellulose (TMSC), chemically modified natural polymers having photoreactive acrylate moieties (e.g. gelatin-MA), or any combination thereof. Application of deep UV and E-beam irradiation can be used to alter the solubility of natural polymers. Using these techniques, many natural polymers behave as resist-like materials for micro-/nano-patterning. Other suitable conductive polymers include but are not limited to polylactide, polycaprolactone, poly(lactide-co-glycolide), polyaniline, polypropylene, polyvinylidene fluoride, polypyrrole, polythiophene, chitosan, gelatin, collagen, heparin, melanin, Polyacetylene(PAc), Poly(p-phenylene) (PPP), Poly(p-phenylenevinylene) (PPV), Polythiophene-vinylene (PTh-V), Poly(2,5-thienylenevinylene) (PTV), Poly(3-alkylthiophene) (PAT), Poly-p-phenylene-sulphide (PPS), Poly(p-phenylene-terephthalamide) (PPTA), Poly (isothianaphthene) (PITN), Poly(α-naphthylamine) (PNA), Polyazulene (PAZ), Polyfuran (PFu), Polyisoprene (PIP), Polybutadiene (PBD), Poly(3-octylthiophnene-3-methylthiophene) (POTMT), Poly(p-phenylene-terephthalamide) (PPTA), (6,6)-phenyl-C61-butyric acid methyl ester (PCBM), poly(2-methoxy-5-(3',7'-dimethyloctyloxy)-1,4-phenylene-vinylene) (MDMO-PPV), regioregular poly(3-hexylthiophene) (RR-P3HT), poly[2,6-(4,4-bis-(2-ethylhexyl)-4H-cyclopenta[2,1-b;3,4-b]-dithiophene)-alt-4,7-(2, 1,3-benzothiadiazole)] (PCPDTBT). The conductive ink is water compatible and can be spin coated or cast on various biodegradable substrates as described herein or on substrates including silicon, glass, ITO, PDMS, etc. to form homogenous films.

In some embodiments, the conductive polymer is at a concentration of 1-50 w/w %, 5-30 w/w %, or 15-20 w/w %. The % doping can vary depending on carrier material (such as photoresist) used and the nature of the dopant.

In some embodiments, the carrier comprises a photoactive protein (i.e. a protein conjugated to a photoactive moiety) as described in U.S. Pat. No. 9,771,400 incorporated herein by reference. The term photoactive refers to a substance capable of a chemical or physical change in response to illumination. Photoreactive moieties/groups may include but are not limited to acrylates, methacrylates, and vinyl ethers. Different reagents having photoreactive moieties may be used provided that core sequences of the natural/native silk protein are retained in the conjugate product. In the case of fibroin, the reaction of the fibroin and the reagent should result in a fibroin conjugate which retains β-sheets of -Gly-Ala-Gly-Ala-Gly-Ser-core sequence of natural fibroin protein. Photo-(re)active additions to fibroin may be achieved by taking advantage of one or more variable R groups in the protein structure, namely primary amines ($NH_2$, e.g. lysine), carboxyls (—COOH, e.g. aspartic acid and glutamic acid), sulfhydryl groups (—SH, e.g. cysteine), and hydroxyls (—OH, e.g. serine, threonine, and tyrosine). Any associated or modified proteins containing such reactive groups may also be used in alternative embodiments.

In some embodiments, the conductive ink is dosed with small amounts of reduced graphene oxide (rGO), e.g. at a concentration of less than 1%. In some embodiments, the dose of rGO is between 1-10%. The addition of rGO may lead to improvements in electrochemical stability and may further enhance the mechanical properties of the ink, causing reduction in swelling and shrinking during long-term cycling. Therefore, the rGO doped composite ink may exhibit an improved stability. Other forms of dopants can be used. These include, but are not limited to, Carbon-based materials: carbon nanotubes, graphite particles, carbon fibers; molybdenum disulfide ($MoS_2$); tungsten disulfide (WS2); dichalcogenides and chalcogenides: $SnS_2$, CuS; metal oxides: $MnO_2$, ZnO, indium tin oxide, or any combination thereof.

In some embodiments, a photoiniator is added to the conductive ink before use. Photoinitiators such as DAROCUR® 1173 (2-Hydroxy-2-methyl-1-phenyl-propan-1-one) and IRGACURE® 2959 (1-[4-(2-Hydroxyethoxy)-phenyl]-2-hydroxy-2-methyl-1-propane-1-one) can be obtained from, e.g., Ciba Specialty Chemicals (Tarrytown, N.Y.). Various classes of photoinitiators for UV curing include but are not limited to hydroxyalkylphenones, acyl phosphine oxides, benzil ketals, benzophenone derivatives, thioxanthone derivatives, benzoin derivatives, alpha hydroxyketones and alpha amino ketones. Similarly, Bis Acyl Phosphine Oxide (BAPO) type of photoinitiators such as IRGACURE® 819 are especially designed to be activated by longer wavelength UV light in the near visible region above 430 nm. Other known photoinitiators include benzoin, benzoin alkyl ethers, benzophenone, anthraquinone, benzil, Michler's ketone, and a mixture of biimidazole and Michler's ketone. Compounding systems such as biimidazole and dialkylaminostyryl derivatives, S-triazine and cyanine derivatives, and S-triazine and thiapyrylium derivatives may also be used.

The patterning of the biocompatible conductive ink to form electrodes may be performed using photolithography. Photolithography, also termed optical lithography or UV lithography, is a process used in microfabrication to pattern parts of a thin film or the bulk of a substrate. It uses light to transfer a geometric pattern from a photomask to a light-sensitive chemical "photoresist", or simply "resist," on the substrate. A series of chemical treatments then either engraves the exposure pattern into, or enables deposition of a new material in the desired pattern upon the material underneath the photo resist. In some embodiments, patterning is performed by a process including, but not limited to, electron lithography, X-ray lithography, ion-beam lithography, soft lithography, nano-imprint lithography, stencil printing, dip-pen lithography, ink-jet printing, and additive 3D printing techniques (such as stereolithography).

In some embodiments, the device is fabricated using photolithography with only water as the solvent which creates the ability to form biofriendly devices in an environmentally sustainable process. In some embodiments, the fabrication process is performed at room temperature, e.g. about 20-25° C.

Various photolithographic techniques are known in the art, e.g. those disclosed in U.S. Pat. No. 9,771,400 incorporated herein by reference. Using photolithography, silk or other protein features can be patterned at sub-microscale resolution (≤μm) over macroscale areas (e.g. several cm). AFM and SEM imaging show microscale patterns in three dimensions (3D) can be formed at least in the size range of 1-100 μm in a height dimension (i.e. perpendicular to a substrate surface). Films and other structures of thicknesses greater than 100 μm are also possible. Resolution in a dimension parallel with the substrate (e.g. a line width) may be at least as small as 3 μm.

Figure 1A:
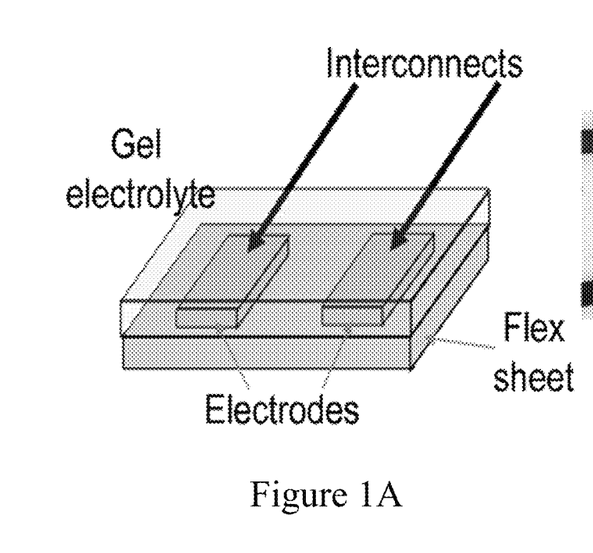
FIG. 1A-B. Diagram of an exemplary supercapacitor in a (A) strip pattern and (B) interdigitated pattern according to some embodiments of the disclosure.
Figure 1B:
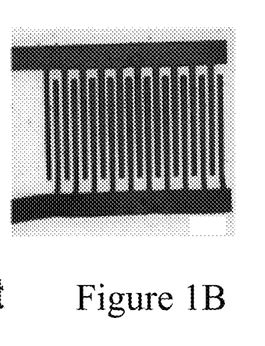

Since the design and complexity of the microarchitectures are only limited by the mask, any type of SC design can be realized by using this technique and ink. Two exemplary patterns include a strip pattern (FIG. 1A) and an interdigitated pattern (FIG. 1B).

A gel electrolyte may be used to interconnect the electrodes patterned from the conductive ink. Generally, gel electrolytes are made of a polymeric material as matrix and an electrolyte salt to provide mobile ions. For example, the gel electrolyte of the disclosure is NaCl-agarose. Other suitable polymer matrices include, but are not limited to polyvinyl alcohol, polyethylene glycol, gelatin, agar, gum-based material, cellulose, poly(ethylene oxide) (PEO), poly (propylene oxide) (PPO), poly(acrylonitrile) (PAN), poly (methyl methacrylate) (PMMA), poly(vinyl chloride) (PVC), poly(vinylidene fluoride) (PVdF), poly(vinylidene fluoride-hexafluoro propylene) (PVdF-HFP), or any combination thereof. Other suitable electrolytes include, but are not limited to $H_2SO_4$, $H_3PO_4$, KCl, KOH, ionic liquids, buffer solutions, organic and inorganic salts, LiOH, NaBr, $Na_2SO_4$, $NaNO_3$, $Li_2SO_4$, NaOH, LiCl, $Li_2SO_4$, $LiClO_4$, $K_2SO_4$, $KNO_3$), $Ca(NO_3)_2$, $MgSO_4$, tetraethylammonium tetrafluoroborate ($TEABF_4$), Tetraethyl ammonium difluoro (oxalato)borate (TEAODFB), $TEMABF_4$, $SBPBF_4$, $LiPF_6$, $NaPF_6$, $Bu_4NBF_4$, LiTFSI, or any combination thereof.

The SC of the disclosure may exhibit a high capacity, e.g. greater than about 100, 125, or 150 F/g at 1 A/g current density. The SC may retain its capacitive properties over a number of days inside liquid medium, e.g. more than 1 week, more than one month, or more than 1 year.

The SC of the disclosure may have applications in areas such as embedded tissue monitoring, recording in in vivo environments, powering implantable bio-electronics and biosensors, energy storage fabrics etc. The benign nature of the conductive ink allows encapsulation of biomolecules such as proteins, enzymes, antibodies, or DNA within the ink which could not be accomplished using conventional methods of patterning conducting polymers. The SCs may be connected to, e.g. a sensor or electronic device, using conventional (metal) wiring. Alternatively, the SC may be coupled to a sensor or electronic device using degradable wires.

It is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

The invention is further described by the following non-limiting examples which further illustrate the invention, and are not intended, nor should they be interpreted to, limit the scope of the invention.

Example. Flexible, Biodegradable, and Biocompatible Supercapacitors

Recent advances in bioelectronics have enabled the use of flexible and thin-film like devices for epidermal and implantable applications. However, current energy delivery and storage devices lack such flexibility and miniaturization. Therefore, integration of such systems is facing a bottleneck. As a result, long term applications of flexible bioelectronic devices are limited. Many current energy storage devices are made from toxic electrolytes and harsh fabrication procedures that may not be suitable for such applications. Here, we report a silk protein based biocompatible and biodegradable thin film supercapacitor system having PEDOT:PSS and rGO composite for making electrodes and which uses agarose and NaCl based gel electrolyte. The supercapacitor exhibits high capacity (~148 F/g at 1 A/g current density) and cycling stability over 500 cycles. The device is flexible and can sustain cyclic mechanical stresses over 450 cycles. The devices retain their capacitive properties over a number of days inside liquid medium. The device can be completely biodegraded over the period of ~1 month making it a suitable choice for an implant and forget kind of system. These protein-based all polymer devices provide a better alternative over current energy storage systems used for powering flexible and implantable bioelectronic devices.

Material and Methods

Synthesis of Carrier Protein Photoresist:

The carrier and support materials were fabricated from silk proteins—fibroin and sericin photoresists, prepared following our earlier works [32, 33]. Fibroin was degummed and purified from silk cocoons (*B. mori*) as instructed elsewhere [34]. Sericin was procured in pure form (Wako Chemicals, Richmond, Va.). The photoreactive moieties were conjugated with the proteins. Briefly, the proteins were first dissolved in 1 M LiCl/DMSO solution and reacted with a stoichiometric amount of 2-isocyanatoethyl methacrylate (IEM) at 60° C. and 5 h in a dry nitrogen purged system. Subsequently, the mixture was poured into excess cold ethanol to precipitate out the protein with pendant methacrylate groups. The products were washed in a 50-50 mixture of cold ethanol/acetone, centrifuged, and lyophilized for 48 h to obtain the final product.

Formation of Photocrosslinkable Conductive Ink:

The conductive ink to form the electrodes was formed by adding together four components: sericin protein photoresist (SPP) as carrier, PEDOT:PSS as the active material, rGO as dopant, and DMSO as plasticizer. First, dry re-dispersible pellets of PEDOT:PSS (ORGACON™, Sigma-Aldrich, St. Louis, Mo.) were ultrasonicated for 20 min in water, and filtered with 0.25 μm syringe filter to obtain 1.0% w/v solution. 5% (v/v) DMSO was added to PEDOT:PSS to enhance the conductivity and improve plasticity of conductive ink. In the second step, graphene oxide (GO) was reduced in water at room temperature following a procedure reported elsewhere [35]. Briefly, 2 mg/ml graphene oxide (GO) solution (University Wafer, South Boston, Mass., USA) was reduced with ascorbic acid (Fisher Scientific, Asheville, N.C.) 5 mg per 1 mg of GO under continuous stirring at room temperature for 1 hour. The reduction of GO to rGO was confirmed by UV-Vis absorption spectra which shifted from 230 nm to 262 nm. Freshly reduced rGO was used to avoid precipitation. Sericin and rGO solution were added to PEDOT:PSS solution to form conductive ink with specific compositions. DAROCUR® 1173 (2-Hydroxy-2-methyl-1-phenyl-propan-1-one from BASF) (0.1 μl/1 mg of SPP) was added as a photoinitiator in the ink prior to use.

Fabrication of Conductive Ink Patterns on Fibroin Films:

Support films for the supercapacitor were prepared by casting a 6.15% (w/v) solution of FPP in formic acid (Acros Organics 98%). The samples were prepared by casting the solutions on silicon or glass substrates and crosslinking under 365 nm UV light for 3 s. Conductive ink was drop casted on fibroin film substrate and allowed to air dry in the dark. Following air drying, patterning was performed via contact-photolithography using a dark-field mask by UV exposure for 2.5 s. The electrode patterns were developed in water to obtain defined conductive ink patterns.

Electrolyte Gel Development:

NaCl was dissolved in 10 ml of DI water to form a 5M NaCl solution. 100 mg agarose (Sigma-Aldrich, St. Louis, Mo.) was added. The agarose was melted and dissolved in solution by heating in a water bath at 90° C. for 2 hours. To compare with traditional electrolytes, a PVA-$H_3PO_4$ system was studied. 0.2 gram PVA (9000 mw, 80% hydrolyzed) (Fisher Scientific, Asheville, N.C.) was mixed with 2 ml of water and heated under continuous stirring until the solution became clear. Then 0.16 grams of $H_3PO_4$ was added.

Electrochemical Experiments:

Cyclic voltammetry (CV), galvanostatic charge-discharge (C-D) and electrochemical impedance spectroscopy (EIS) were used. All electrochemical characterizations were conducted with two-electrode cell configuration. 5 M NaCl-Agarose or 0.8 M $H_3PO_4$-PVA gel electrolytes were used within the potential range of 0 to 0.5 V and 0 to 1.0 V for C-D or CV experiments. The EIS data were collected in a frequency range of 0.01 Hz to $10^4$ Hz with a 5 mV AC amplitude. The capacitance of the device was calculated from the galvanostatic charge-discharge (C-D) curves following the equations shown below:[22]

$$C_{device} = \frac{i_{app}}{-\Delta E/\Delta t} \quad (1)$$

where $i_{app}$ is the discharge current (A), $\Delta E$ is discharging voltage and $\Delta t$ is the discharge time.

The various specific capacitance were calculated by the following equations:

$$C_s = \frac{C_{device}}{m} \quad (2)$$

$$C_a = \frac{C_{device}}{a} \quad (3)$$

$$C_v = \frac{C_{device}}{v} \quad (4)$$

where $C_s$, $C_a$ and $C_v$ are gravimetric, areal, and volumetric specific capacitance respectively. m, a, and v are the mass, area, and volume of active material on electrode. The energy density (E, Wh $kg^{-1}$) and the power density (P, W $kg^{-1}$) of a supercapacitor in two cell-electrode configurations were obtained by the following equations:

$$E = \frac{1}{2} C_s \Delta V^2 \quad (5)$$

$$P = \frac{E}{\Delta t} \quad (6)$$

Bio-Resorption and Imaging of Devices:

Biodegradability of the devices has been shown by enzymatic degradation over time. Two sets of devices (4 mg of protein total) were incubated either in 10 ml of protease (1 U/mg of protein) (Protease XIV from *S. Griseus*, Sigma-Aldrich) or PBS buffer at 37° C. The enzyme solution was replaced every third day to preserve activity. Every week, one sample from each set was removed, washed with deionized water, and dried for further study. The study was carried out for 3 weeks. The films were imaged using scanning electron microscopy (SEM) to observe the changes in the surface morphology. Optical and scanning electron microscopy (SEM) images were taken on a Nikon Eclipse LV-100D and Hitachi FE-SEM SU-70 instruments respectively. The patterns were first sputter coated in 20 Å platinum Denton vacuum V cold sputtering system (Moorestown, N.J.).

Results and Discussion

There have been earlier attempts to form energy storage devices for bioelectronic applications having natural polymers or biomolecules to improve biocompatibility and electrochemical stability in physiological medium [36-38]. The use of nonbiodegradable configurations such as use of metal or metal oxide charge collectors makes these systems applicable where implants need to stay for a very long time, e.g. about a year [38]. But these are unsuitable for an implant and forget type of system or where a relatively shorter implant life is required. Therefore, we developed a system which is a completely metal/metal oxide free biodegradable supercapacitor. In our earlier works, we have shown that the silk sericin protein provides a stable and biodegradable matrix for entrapping conducting polymer such as PEDOT:PSS. The use of a photoreactive moiety conjugated silk sericin, a water based photopatternable ink. The ink can be patterned on both rigid and flexible substrates enabling patterning of PEDOT:PSS in a benign fashion. In this work, improvement of the capacitive nature of the ink electrode is achieved by doping of rGO in conductive ink, still preserving the biodegradable nature.

Biofriendly Conductive Ink and Gel Electrolyte for Supercapacitors

PEDOT:PSS is a promising material for bioelectronics applications due to its stability in biological medium and soft/flexible nature. It is also considered to be suitable as SC electrode material due to its electrical and ionic conductivity, and electrical and electrochemical stability for long periods. On the other hand, nanoscale carbon material, such as graphene has attracted attention due to its high capacitance due to extremely high surface area leading to better double layer properties and electrochemical stability. Graphene has theoretical electrical double layer capacitance values up to 550 F/g [39]. However, parallel stacking of graphene sheets limits its capacitance values to very low levels. It has been shown that the incorporation rGO with PEDOT:PSS greatly reduces the re-stacking of rGO and improves flexibility of the electrode at the same time [29]. Even though in previous works composite made of conductive polymer and rGO showed very high specific capacitance of ~300 F/g [40]. Again, the use of a metallic charge collector makes the system unsuitable for short term implantation. Further, sandwich like schemes are complicated for integration with flexible and thin film based bioelectronic devices. Therefore, a planar interdigitated scheme of supercapacitor is better for bioelectronic applications. Inkjet printing and stencil printing are primarily being used for fabrication of interdigitated supercapacitors, but only sub millimeter scale feature sizes have been shown. Also, those techniques rely on the physical adhesion of pattern to the substrate, therefore, stability of the electrodes in wet medium is still questionable. Therefore, this work is directed towards the development of a sustainable, green technique to utilize these types electroactive composite materials to form interdigitated supercapacitors. We showed the effective use of SPP to form an electroactive ink with PEDOT:PSS. We further incorporate rGO in the conductive ink matrix to improve the capacitive behavior of the ink.

rGO is commonly obtained after the reduction of commercially available GO in aqueous dispersions. There have been several reports to reduce GO either thermally, chemically or electrochemically. All these processes either uses harsh conditions or chemicals, thus, making them unworthy to be used to develop a sustainable technology. In this work, we utilized an earlier shown biofriendly reduction process of GO with ascorbic acid [35]. The reduction of GO to rGO was confirmed by observing shift of UV-vis absorption peak from 230 to 264 nm. Thus, obtained rGO was directly mixed SPP-PEDOT:PSS conductive ink to obtain rGO doped conductive ink.

As mentioned earlier, there are numerous ion conducting materials either acidic, basic, or neutral and gel matrix forming materials are available to obtain high capacitive performance, yet most of them alone or in combination become unsuitable for biological applications. Therefore, we chose agarose, a polysaccharide, and NaCl, a neutral salt, to form a green electrolyte gel for the present work [31]. Agarose is a hydrophilic polymer often obtained from seaweed. It is widely used for biomedical applications due to its non-immunogenic and anti-fouling properties. One of the challenging aspects in developing implantable systems is that it should be resistant to non-specific adsorption of protein or biofouling to be specific. Biofouling is one of the prime reasons behind the failure of electrodes in physiological medium. Here the electrolyte system was chosen for its superior biocompatibility.

Figure 2:
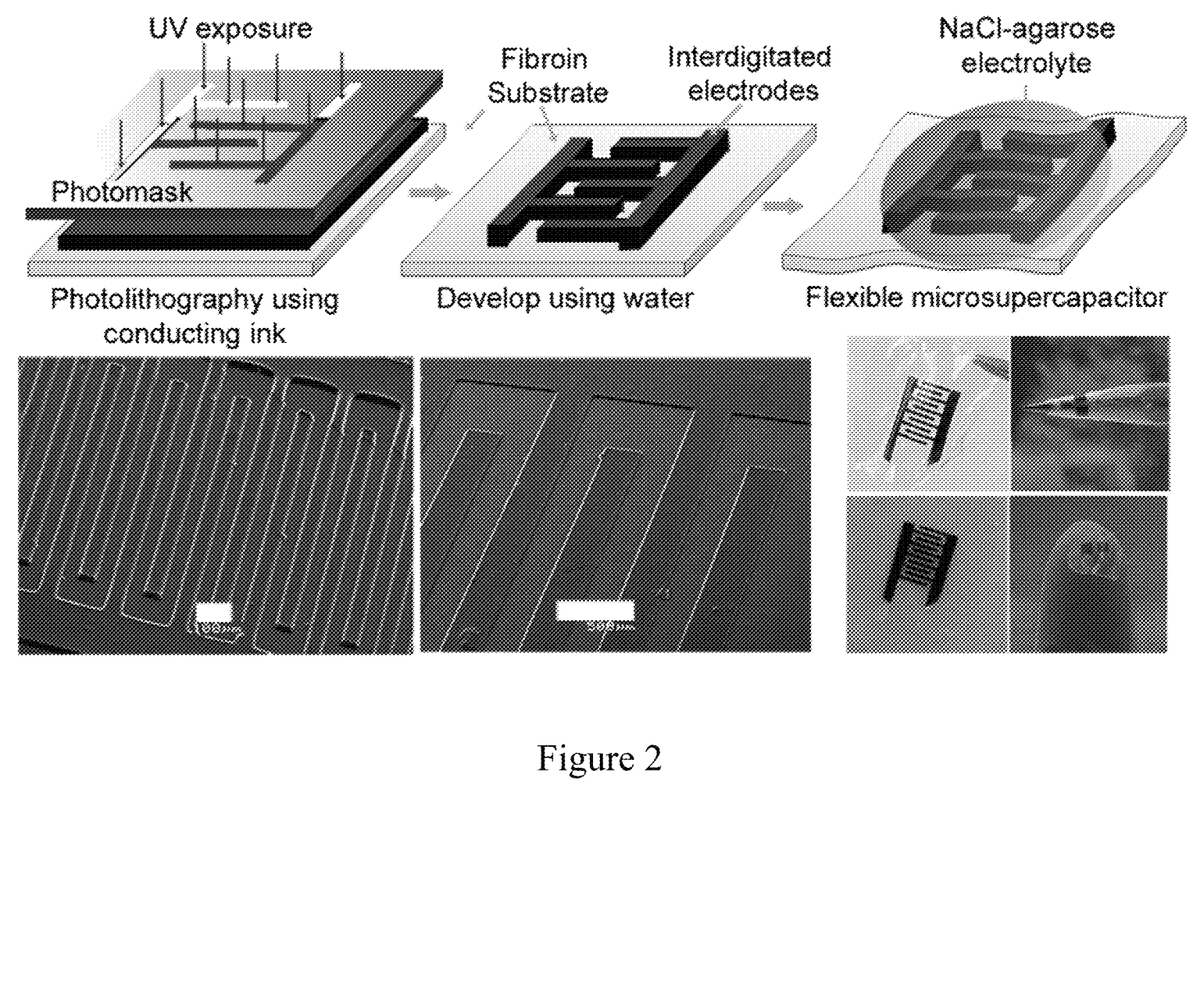
FIG. 2. Fabrication of a supercapacitor device according to some embodiments of the disclosure.

The fabrication of a supercapacitor device is shown in FIG. 2. First, 2 mg/ml rGO stock solution and 1% (wt./vol) PEDOT:PSS solution having 5% (vol) DMSO were prepared separately. The two solution were mixed together with SPP and photoinitiator to form a conductive ink. FPP films were prepared by drop casting the FPP solution in formic acid (FA) on a glass substrate. The FPP film was crosslinked by shining UV light. Specified amounts of conductive ink was drop casted and air dried in hood. Patterning was done via photolithography, which is a highly efficient technique to produce high resolution microscale patterns in a reproducible manner. Two types of patterns were used for the work. For initial characterization of conductive ink, two strip patterns were made while the interdigitated patterns were used for stability testing. Since the design and complexity of the microarchitectures are only limited by the mask, any type of supercapacitor design can be realized by using this technique and ink. Due to the formation of covalent bonds between substrate and pattern, a critical problem of pattern delamination due to mechanical stress can be avoided. Further, the ink can be patterned on a variety of rigid and flexible substrates functionalized with methacrylate pendent groups to form vinyl bonds with SPP in ink. Since the whole fabrication process was pursued on a benchtop and comprised an all water based process at room temperature, the supercapacitor fabrication process is sustainable and green.

Electrochemical Characterization of rGO Doped Conductive Ink

Figure 3A:
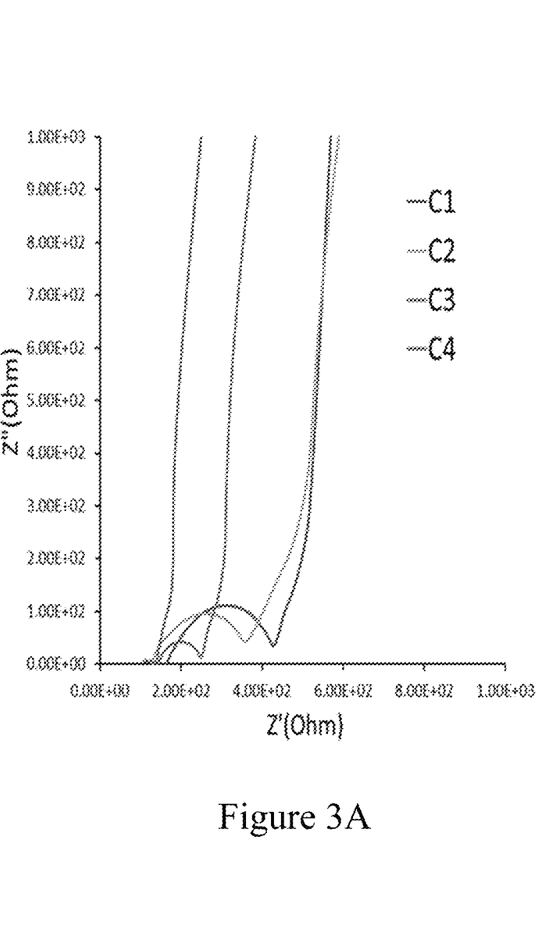
FIG. 3A-B. Electrochemical characterization of exemplary conductive ink compositions with (A) electrochemical impedance spectroscopy (EIS), and (B) Effect of scan rate on capacitance behavior of fourth composition.

In order to first understand the conductive ink's capacitive properties, electrochemical impedance spectroscopy (EIS) and cyclic voltammetry (CV) techniques were utilized. Four conductive ink compositions, shown in table 1, were first casted on ITO/glass substrate and the electrode area was defined by covering the electrode with PTFE tape and keeping a ⅛" diameter size hole open. The EIS measurements were done in a three-electrode electrochemical cell having 0.1 M PBS buffer solution as electrolyte. The frequency response of electrode/electrolyte system is usually shown as a Nyquist plot of the imaginary component (Z") of the impedance against the real component (Z'). The Nyquist plots obtained for all four compositions of conductive ink are shown in FIG. 3A. Each data point is obtained at a different frequency with the lower left portion of the curve corresponding to the higher frequencies. The electrode EIS spectra show more closely to an ideal capacitor the more vertical the curve at lower frequency regime. The part of complex impedance (Z') obtained by linear interpolation of the low frequency part of the Nyquist curve to Z"=0 often represents the internal or equivalent series resistance (ESR) of the cell which limits the rate the cell can be charged/discharged (power performance). The slope of the 45° portion of the curve signifies the Warburg resistance and is caused by the frequency dependence of ion diffusion/transport in the electrolyte. In FIG. 3A, the increase of conductive polymer and rGO content in ink causes lower ESR and therefore, better capacitive performance can be obtained. The sample having 8.16% rGO concentration shows a very low ESR of ~130Ω. The ESR values for all compositions are reported in table 2. Also, as the conductive material content is increased, the spectra become more vertical at lower frequency regimes further indicative of a higher capacitive nature.

TABLE 1

Conductive ink compositions.

| Composition | Protein carrier (%) | PEDOT:PSS (%) | rGO (%) |
|---|---|---|---|
| C1 | 70.6 | 28 | 1.4 |
| C2 | 66.6 | 28 | 5.4 |
| C3 | 49.8 | 48 | 2.2 |
| C4 | 43.84 | 48 | 8.16 |

TABLE 2

Equivalent series resistance (ESR) values from Electrochemical Impedance Spectroscopy measurements.

| | Composition | | | |
|---|---|---|---|---|
| | 1 | 2 | 3 | 4 |
| ESR (Ω) | 425.1 | 245.3 | 247.6 | 130.7 |

Figure 3B:
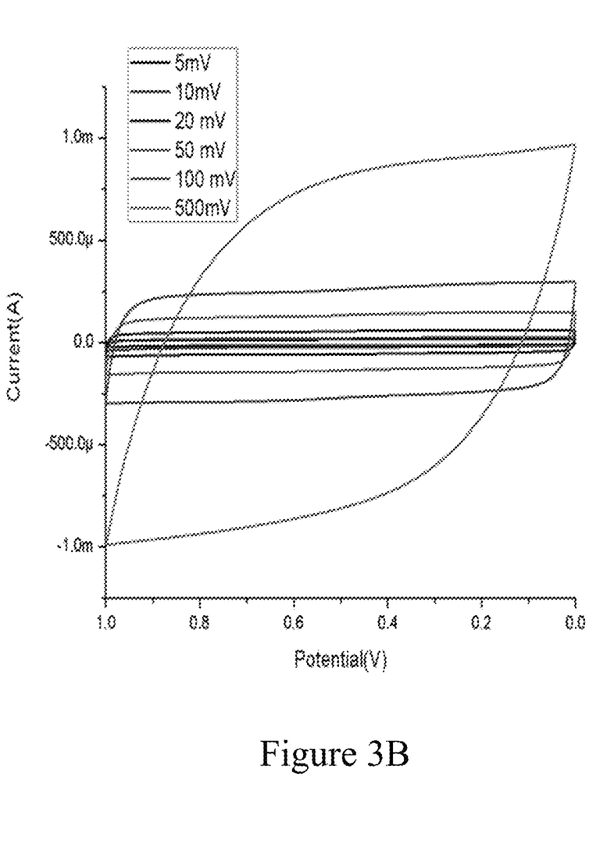

To further confirm the capacitive nature of the conductive ink, two parallel electrodes were patterned on silk fibroin films. In this case, the agarose/NaCl gel electrolyte was used to perform cyclic voltammetry (CV) experiments. FIG. 3B shows the cyclic voltammogram of the 4$^{th}$ composition at a scan rate varying from 5 mV/s to 500 mV/s. FIG. 3B portrays the characteristic symmetric and square shape of voltammogram up to 500 mV/s scan rate is indicative of typical double layer supercapacitor charge injection mechanism. Also, comparative CV measurements conducted for all four compositions acquired at a scan rate of 50 mV/s also depict that the increase of conductive material in ink improves the capacitance behavior. Here, the capacitive performance could be further increased by reducing silk sericin content in the composite ink. But too much of a reduction of sericin content may render the ink unsuitable for patterning. The composite material developed here can be used without adding any sericin if micropatterning is not required. The above characterization indicates that the conductive ink shows a very good capacitive behavior either as capacitive coating or as a standalone electrode material for a supercapacitor. The versatility of the material applicability is augmented by the fact that the material can be photolithographically patterned on any functionalized substrate.

Performance of Supercapacitors

Figure 4A:
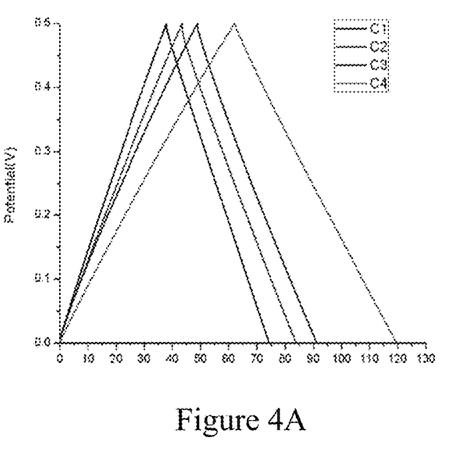
FIG. 4A-D. Performance evaluation of supercapacitors: (A) galvanostatic charge-discharge for compositions, (B) galvanostatic rate performance, (C) current stability, and (D) Ragone plot of overall energy storage material performance.
Figure 4B:
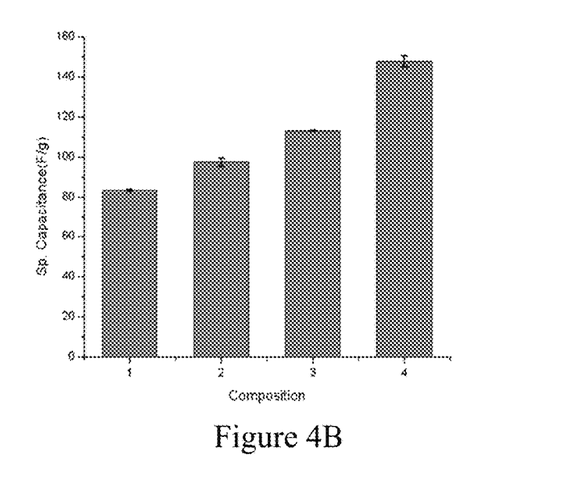
Figure 4C:
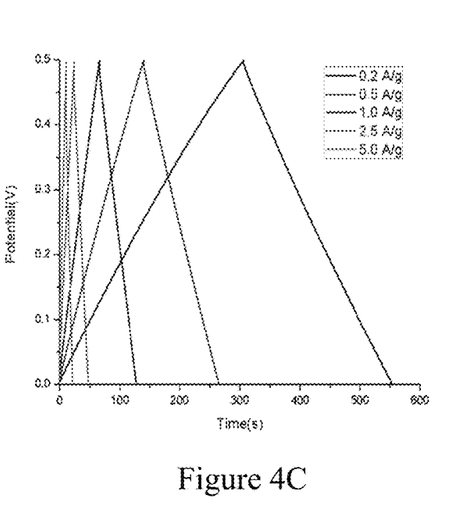

The capacitive performance of supercapacitors was evaluated by galvanostatic charge/discharge experiments. The initial experiments with two parallel strip electrodes made from all four compositions of ink show the similar behavior observed with CV shown earlier that the increase of PEDOT:PSS and rGO in ink enhances the capacitive nature of material. The SC made from the fourth composition having 48% PEDOT:PSS and 8.16% rGO, provided an impressive specific gravimetric capacitance of 148.28 F/g. The sp. capacitance obtained for the device is very competitive. The highest reported sp. capacitance for similar conductive composite systems is ~380 F/g [41]. But the use of $H_2SO_4$ electrolyte and carbon cloth charge collector makes the system unsuitable for biological applications. The other reports on similar systems report much lower sp. capacitance ranging from 100-200 F/g [29, 42, 43]. The charge-discharge curves for all four compositions at current density of 1 A/g is shown in FIG. 4A. Charge-discharge experiments were done in triplicates and their rate performance is shown in FIG. 4B. The linear profile of galvanostatic charge and discharge curves of all compositions and their symmetric triangular shapes are indicative of nearly ideal capacitive characteristics. Since the intended application of the SC is as wearable and implantable devices, a potential window of 0-0.5V was used which is well away from the water electrolysis window. It must be noted here that the patterns were made of fibroin films and did not have conventional metallic or metal oxide charge collectors. The strip patterns were connected to silver wires with silver paste at one end, then sealed using hermetic epoxy to avoid noise due to the metal electrolyte interface. Further, the material is stable up to current 5 A/g (FIG. 4C). As the current density is increased, the discharge time decreases but no appreciable change in specific capacitance of the system was observed (table 3). The independence of sp. capacitance on current density is a characteristic of ideal capacitor behavior. The electroactivity of a material depends on the speed of loading-unloading of charges through its matrix, and the number of active sites offered by the electrode. The increase in i-R drop from low to high current density shows that the effect of internal resistance plays a role at higher loading-unloading of charges. Still, the charge-discharge curves at all current densities remains mostly triangular and symmetric indicative of stability of the system at various current loads.

TABLE 3

Effect of current density on capacitance.

| | Current density (A/g) | | | | |
| --- | --- | --- | --- | --- | --- |
| | 0.2 | 0.5 | 1 | 2.5 | 5 |
| Specific Capacitance (F/g) | 141 | 142.8 | 144.7 | 143 | 141.4 |

To further compare the conductive ink with other systems, two types of experiments were conducted. In the first experiment, conductive ink having 8.14% rGO was casted on ITO/glass substrate and tested with an agarose-NaCl electrolyte system. In the second experiment, PVA-$H_3PO_4$ electrolyte was tested with strip patterns having 8.14% rGO. We observed that the sp. capacitance of the supercapacitors increased to ~221 F/g and ~178 F/g for experiments with ITO and PVA-$H_3PO_4$ systems respectively. These experiments are indicative of the possibility of achieving better capacitive properties with this material with a conventional supercapacitor configuration.

Figure 4D:
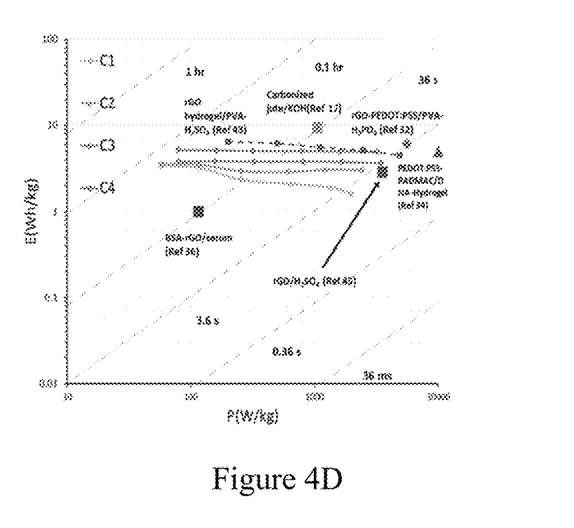
Figure 5A:
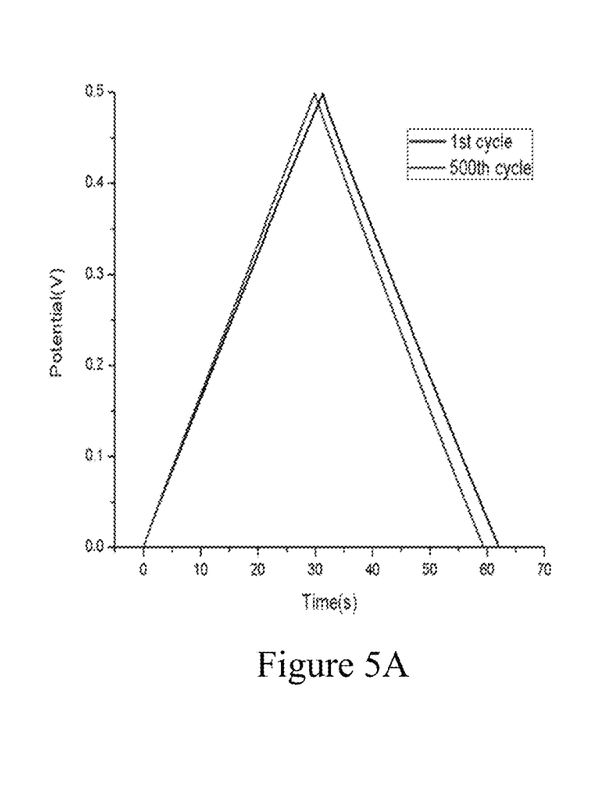
FIG. 5A-B. Stability of supercapacitor: (A) change in charge-discharge curve after 500 cycles and (B) change in capacitance over number cycles.
Figure 5B:
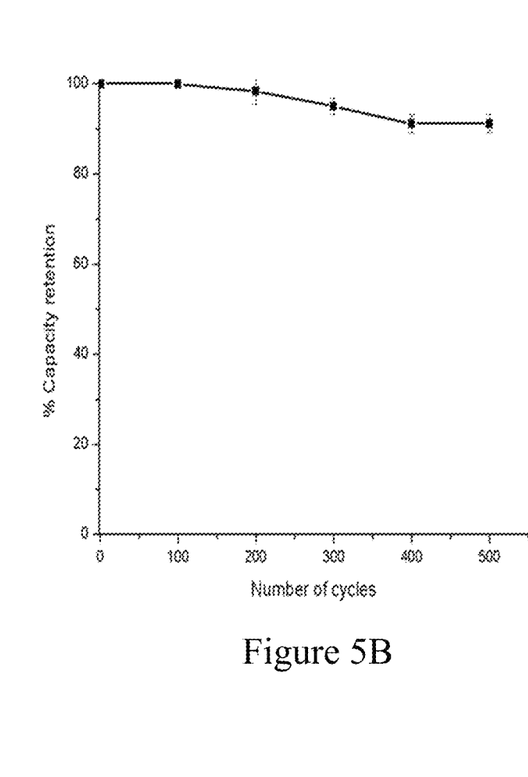

The overall performance of any energy storage material is usually shown on a Ragone plot (FIG. 4D). The electrode with the highest PEDOT:PSS-rGO content can achieve a maximum power and energy density, ~3229 W/kg and 5.19 Wh/kg respectively. The energy and power density obtained in this work is similar or better than previous works having conductive material in non-conductive matrix or having combination of rGO/PEDOT:PSS supercapacitor system [29, 38, 42, 44-46]. Finally, the interdigitated supercapacitor design was tested with the $4^{th}$ composition and found have similar charge storage capacity as when the patterns were only two parallel strips. Also, interdigitated patterns were fixed with silver wires at the very end and insulated with epoxy. It was done to ensure that the supercapacitor device stays metal free and to avoid any false enhancement in capacitive behavior due to contact of electrolyte with silver. To test the long-term stability of the supercapacitors, 500 run cycles were done on three samples. Assuming 10 times charging a day, the device only needs to be stable for 300 hundred runs. The stability experiment revealed capacity retention after 500 cycles is ~91% and the charge-discharge curve remain symmetric and triangular without increase in I-R drop (FIGS. 5A and B). The percentage retention of the sample shows that within useful range of life cycle the supercapacitor retains most of its electroactivity. Conductive polymers have been found to be unstable during the long-term charge/discharge processes, which is a major drawback in using for supercapacitor applications [47]. In our previous work we have shown that after 200 electrochemical cycles the electroactivity retention was 90.5% [28]. Whereas, in the present system the electroactivity retention after 500 cycles is similar to our previously reported values. Therefore, improvements in electrochemical stability has been observed with addition of rGO in conductive ink. Also, rGO doping might be further enhancing mechanical properties of the ink, causing reduction in swelling and shrinking during the long-term cycling. Therefore, the rGO doped composite ink exhibit an improved stability compared to our earlier developed conductive ink.

Bendability of Supercapacitors

Figure 6A:
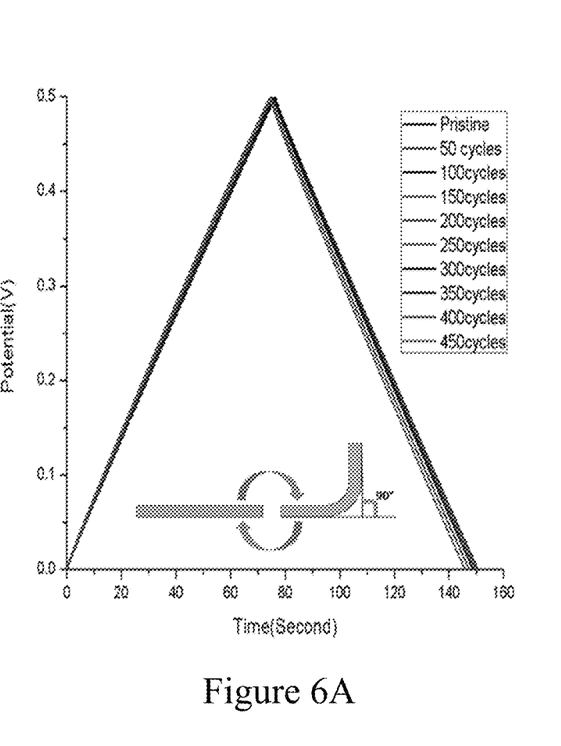
FIG. 6A-B. Stability under mechanical stress: (A) under cyclic stress cycles and (B) under steady U-bend.
Figure 6B:
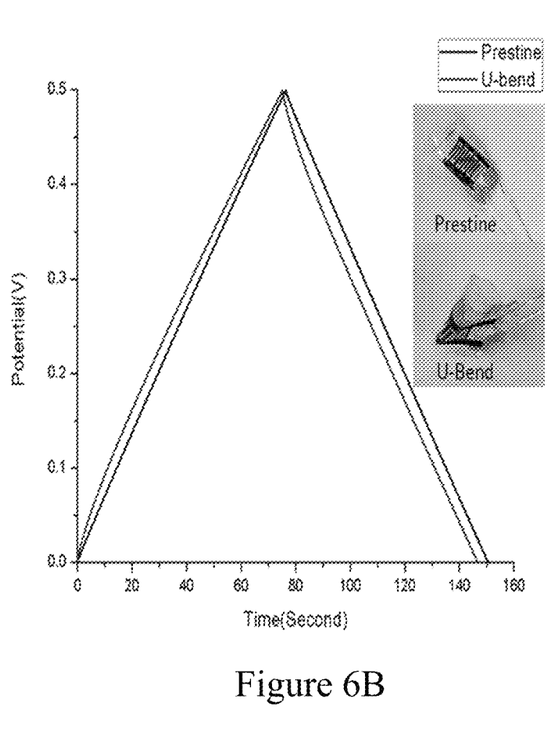
Figure 7A:
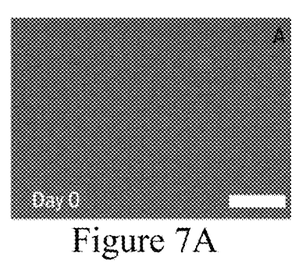
FIG. 7A-G. Proteolytic degradation PEDOT:PSS-Silk supercapacitor devices: SEM images of conductive ink-silk proteins (A) at day 0, (B, C, and D) at day 7, 14, and 21 in PBS buffer respectively, and (E, F, and G) at day 7, 14, and 21 in protease enzyme solution respectively.
Figure 7B:
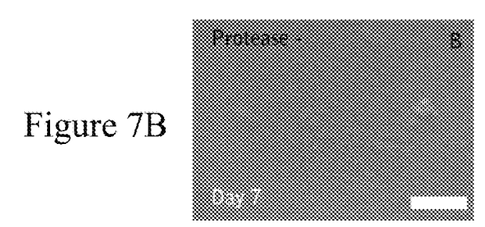
Figure 7C:
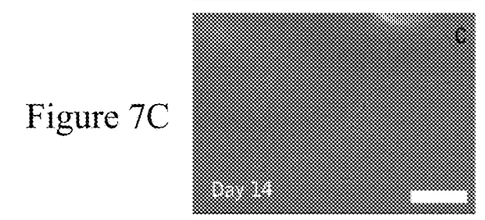
Figure 7D:
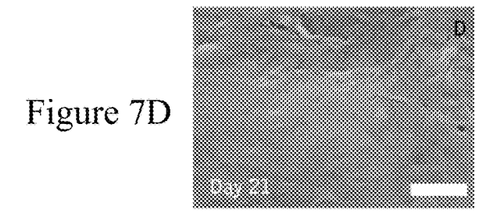
Figure 7E:
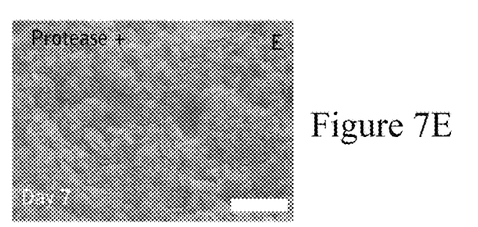
Figure 7F:
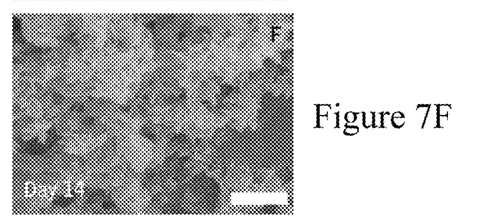
Figure 7G:
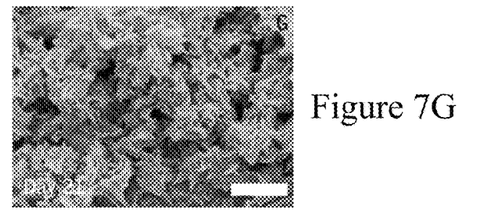

The nature of implantable bioelectronics application always involve movement inside the subject's body. Therefore, one important performance criteria is to evaluate device stability under different mechanical deformation states. The supercapacitor device shows a negligible decrease in capacitance after a 180° steady bend. The i-R drop increased a bit from 3 mV (flat) to 6 mV (180° bend) as shown in FIG. 6A. We further studied the capacitance retention of device during cyclic bending test where the device was bent up to 90° and flexed back in a cycle. An impressive capacitance retention of 97.5% even after 450 cycles was observed (FIG. 6B). These experiments suggest that the device has excellent stability under applied mechanical stress.

The overall results presented in the study establish that the all polymer-silk based supercapacitors show an electrical double layer capacitance behavior. The device made of silk based conductive ink has a fast, reversible capacitive nature. The fact that the device can deliver power densities comparable to the devices having toxic electrolytes and/or conventional charge collectors, and includes green water based processing with readily available material and techniques, provides a suitable alternative for powering implantable flexible devices.

Biodegradability of Supercapacitors

One of the important advantages of using natural biopolymers like silk proteins over synthetic polymers is their bioresorption characteristics. We have previously shown that the modified silk proteins and conductive ink can be degraded under protease action over the period of a month [27]. Since, the system now also contains rGO in matrix, we conducted enzymatic degradation assays. In this process, we kept 3 samples in protease medium and 3 samples in 0.1 M PBS medium (control) at 37° C. One sample from each set were taken out and washed. These samples were imaged using SEM to investigate degradation of supercapacitor samples. FIG. 7A-G shows the SEM images of degradation of composite over three weeks. No appreciable degradation was observed on samples kept in PBS medium even after three weeks. But the samples kept in protease medium were at different stages of degradation in each successive week. At the end of three weeks the film was about to break down as the film nanoscale morphology became fibrous and almost flat. The degradation experiment suggests that the degradation characteristics of conductive ink was not hampered by rGO doping and the conductive ink structures can be fully degraded over the period of a month. It should be noted that the crosslinking of SPP and FPP films/patterns can be controlled very readily by modulating the pendent reactive moieties in the protein backbone, therefore, bioresorption can be tuned as per the need.

CONCLUSIONS

This work demonstrates a green and sustainable fabrication process of a flexible supercapacitor device based on silk proteins. The unique approach involves development of conductive ink for electrodes and a gel electrolyte with benign and readily available materials. The benchtop photolithographic process makes it low cost and easy to replicate in largescale. The excellent interpenetration obtained by PEDOT:PSS and rGO in silk protein matrix, allowed us to obtain a supercapacitor device having excellent rate performance with high energy density and power density, without using any metal or metal oxide background or coatings as electron collectors. The device is bendable and durable under cyclic bending cycles which is important for use with implantable bioelectronic devices. The fact that most of the device is comprised of proteins and polysaccharides (agarose) and can be resorbed inside the body over a month's period makes it suitable for using as a short term implant and forget kind of bioelectronic system. The capacitive performance may be further improved by using acidic electrolytes and a conductive background.

REFERENCES

[1] M. Stoppa, A. Chiolerio, Wearable Electronics and Smart Textiles: A Critical Review, Sensors 14(7) (2014) 11957-11992.

[2] L. M. Castano, A. B. Flatau, Smart fabric sensors and e-textile technologies: a review, Smart Materials and Structures 23(5) (2014).

[3] L. Roselli, N. B. Carvalho, F. Alimenti, P. Mezzanotte, G. Orecchini, M. Virili, C. Mariotti, R. Goncalves, P. Pinho, Smart Surfaces: Large Area Electronics Systems for Internet of Things Enabled by Energy Harvesting, Proceedings of the Ieee 102(11) (2014) 1723-1746.

[4] A. Nathan, A. Ahnood, M. T. Cole, S. Lee, Y. Suzuki, P. Hiralal, F. Bonaccorso, T. Hasan, L. Garcia-Gancedo, A. Dyadyusha, S. Hague, P. Andrew, S. Hofmann, J. Moultrie, D. P. Chu, A. J. Flewitt, A. C. Ferrari, M. J. Kelly, J. Robertson, G. A. J. Amaratunga, W. I. Milne, Flexible Electronics: The Next Ubiquitous Platform, Proceedings of the Ieee 100 (2012) 1486-1517.

[5] R. Jamshidi, S. Cinar, Y. F. Chen, N. Hashemi, R. Montazami, Transient Bioelectronics: Electronic Properties of Silver Microparticle-Based Circuits on Polymeric Substrates Subjected to Mechanical Load, Journal of Polymer Science Part B-Polymer Physics 53(22) (2015) 1603-1610.

[6] R. F. Service, BIOELECTRONICS A soft approach kick-starts cybernetic implants, Science 347(6218) (2015) 114-114.

[7] L. B. Dong, C. J. Xu, Y. Li, Z. H. Huang, F. Y. Kang, Q. H. Yang, X. Zhao, Flexible electrodes and supercapacitors for wearable energy storage: a review by category, Journal of Materials Chemistry A 4(13) (2016) 4659-4685.

[8] V. L. Pushparaj, M. M. Shaijumon, A. Kumar, S. Murugesan, L. Ci, R. Vajtai, R. J. Linhardt, O. Nalamasu, P. M. Ajayan, Flexible energy storage devices based on nanocomposite paper, Proceedings of the National Academy of Sciences of the United States of America 104(34) (2007) 13574-13577.

[9] L. Li, Z. Wu, S. Yuan, X. B. Zhang, Advances and challenges for flexible energy storage and conversion devices and systems, Energy & Environmental Science 7(7) (2014) 2101-2122.

[10] A. Gonzalez, E. Goikolea, J. A. Barrena, R. Mysyk, Review on supercapacitors: Technologies and materials, Renewable & Sustainable Energy Reviews 58 (2016) 1189-1206.

[11] Y. Shi, G. H. Yu, Designing Hierarchically Nanostructured Conductive Polymer Gels for Electrochemical Energy Storage and Conversions, Chemistry of Materials 28(8) (2016) 2466-2477.

[12] G. X. Qu, J. L. Cheng, X. D. Li, D. M. Yuan, P. N. Chen, X. L. Chen, B. Wang, H. S. Peng, A Fiber Supercapacitor with High Energy Density Based on Hollow Graphene/Conducting Polymer Fiber Electrode, Advanced Materials 28(19) (2016) 3646-3652.

[13] G. P. Wang, L. Zhang, J. J. Zhang, A review of electrode materials for electrochemical supercapacitors, Chemical Society Reviews 41(2) (2012) 797-828.

[14] Y. Zheng, Y. B. Yang, S. S. Chen, Q. Yuan, Smart, stretchable and wearable supercapacitors: prospects and challenges, Crystengcomm 18(23) (2016) 4218-4235.

[15] C. Zequine, C. K. Ranaweera, Z. Wang, P. R. Dvornic, P. K. Kahol, S. Singh, P. Tripathi, O. N. Srivastava, B. K. Gupta, G. Gupta, R. K. Gupta, High-Performance Flexible Supercapacitors obtained via Recycled Jute: Bio-Waste to Energy Storage Approach, Scientific Reports 7 (2017).

[16] M. Beidaghi, Y. Gogotsi, Capacitive energy storage in micro-scale devices: recent advances in design and fabrication of micro-supercapacitors, Energy & Environmental Science 7(3) (2014) 867-884.

[17] C. Zhong, Y. D. Deng, W. B. Hu, J. L. Qiao, L. Zhang, J. J. Zhang, A review of electrolyte materials and compositions for electrochemical supercapacitors, Chemical Society Reviews 44(21) (2015) 7484-7539.

[18] M. Irimia-Vladu, "Green" electronics: biodegradable and biocompatible materials and devices for sustainable future, Chemical Society Reviews 43(2) (2014) 588-610.

[19] E. Armelin, M. M. Perez-Madrigal, C. Aleman, D. D. Diaz, Current status and challenges of biohydrogels for applications as supercapacitors and secondary batteries, Journal of Materials Chemistry A 4(23) (2016) 8952-8968.

[20] Y. S. Yun, S. Y. Cho, H. J. Jin, Carbon aerogels based on regenerated silk proteins and graphene oxide for supercapacitors, Macromolecular Research 22(5) (2014) 509-514.

[21] G. A. Ferrero, A. B. Fuertes, M. Sevilla, From Soybean residue to advanced supercapacitors, Scientific Reports 5 (2015).

[22] S. L. Zhang, N. Pan, Supercapacitors Performance Evaluation, Advanced Energy Materials 5(6) (2015).

[23] C. Zequine, C. K. Ranaweera, Z. Wang, S. Singh, P. Tripathi, O. N. Srivastava, B. K. Gupta, K. Ramasamy, P. K. Kahol, P. R. Dvornic, R. K. Gupta, High Performance and Flexible Supercapacitors based on Carbonized Bamboo Fibers for Wide Temperature Applications, Scientific Reports 6 (2016).

[24] C. Zhou, Y. W. Zhang, Y. Y. Li, J. P. Liu, Construction of High-Capacitance 3D CoO@Polypyrrole Nanowire Array Electrode for Aqueous Asymmetric Supercapacitor, Nano Letters 13(5) (2013) 2078-2085.

[25] Z. Q. Niu, L. Zhang, L. Liu, B. W. Zhu, H. B. Dong, X. D. Chen, All-Solid-State Flexible Ultrathin Micro-Supercapacitors Based on Graphene, Advanced Materials 25(29) (2013) 4035-4042.

[26] M. Q. Xue, Z. Xie, L. S. Zhang, X. L. Ma, X. L. Wu, Y. G. Guo, W. G. Song, Z. B. Li, T. B. Cao, Microfluidic etching for fabrication of flexible and all-solid-state micro supercapacitor based on MnO2 nanoparticles, Nanoscale 3(7) (2011) 2703-2708.

[27] R. K. Pal, A. A. Farghaly, M. M. Collinson, S. C. Kundu, V. K. Yadavalli, Photolithographic Micropatterning of Conducting Polymers on Flexible Silk Matrices, Advanced Materials 28(7) (2016) 1406-1412.

[28] R. K. Pal, A. A. Farghaly, C. Z. Wang, M. M. Collinson, S. C. Kundu, V. K. Yadavalli, Conducting polymer-silk biocomposites for flexible and biodegradable electrochemical sensors, Biosensors & Bioelectronics 81 (2016) 294-302.

[29] Y. Q. Liu, B. Weng, J. M. Razal, Q. Xu, C. Zhao, Y. Y. Hou, S. Seyedin, R. Jalili, G. G. Wallace, J. Chen, High-Performance Flexible All-Solid-State Supercapacitor from Large Free-Standing Graphene-PEDOT/PSS Films, Scientific Reports 5 (2015).

[30] H. Tao, D. L. Kaplan, F. G. Omenetto, Silk Materials—A Road to Sustainable High Technology, Advanced Materials 24(21) (2012) 2824-2837.

[31] W. G. Moon, G. P. Kim, M. Lee, H. D. Song, J. Yi, A Biodegradable Gel Electrolyte for Use in High-Performance Flexible Supercapacitors, ACS applied materials & interfaces 7(6) (2015) 3503-3511.

[32] N. E. Kurland, T. Dey, S. C. Kundu, V. K. Yadavalli, Precise patterning of silk microstructures using photolithography, Advanced Materials 25(43) (2013) 6207-6212.

[33] N. E. Kurland, T. Dey, C. Wang, S. C. Kundu, V. K. Yadavalli, Silk protein lithography as a route to fabricate sericin microarchitectures, Advanced Materials 26(26) (2014) 4431-4437.

[34] D. N. Rockwood, R. C. Preda, T. Yucel, X. Q. Wang, M. L. Lovett, D. L. Kaplan, Materials fabrication from Bombyx mori silk fibroin, Nature Protocols 6(10) (2011) 1612-1631.

[35] J. L. Zhang, H. J. Yang, G. X. Shen, P. Cheng, J. Y. Zhang, S. W. Guo, Reduction of graphene oxide via L-ascorbic acid, Chemical Communications 46(7) (2010) 1112-1114.

[36] J. Hur, K. Im, S. Hwang, B. Choi, S. Kim, N. Park, K. Kim, DNA hydrogel-based supercapacitors operating in physiological fluids, Scientific Reports 3 (2013).

[37] C. A. Milroy, A. Manthiram, Bioelectronic Energy Storage: A Pseudocapacitive Hydrogel Composed of Endogenous Biomolecules, Acs Energy Letters 1(4) (2016) 672-677.

[38] I. M. Mosa, A. Pattammattel, K. Kadimisetty, P. Pande, M. F. El-Kady, G. W. Bishop, M. Novak, R. B. Kaner, A. K. Basu, C. V. Kumar, J. F. Rusling, Ultrathin Graphene-Protein Supercapacitors for Miniaturized Bioelectronics, Advanced Energy Materials 1700358-n/a.

[39] C. G. Liu, Z. N. Yu, D. Neff, A. Zhamu, B. Z. Jang, Graphene-Based Supercapacitor with an Ultrahigh Energy Density, Nano Letters 10(12) (2010) 4863-4868.

[40] J. T. Zhang, X. S. Zhao, Conducting Polymers Directly Coated on Reduced Graphene Oxide Sheets as High-Performance Supercapacitor Electrodes, Journal of Physical Chemistry C 116(9) (2012) 5420-5426.

[41] Y. Shi, L. J. Pan, B. R. Liu, Y. Q. Wang, Y. Cui, Z. A. Bao, G. H. Yu, Nanostructured conductive polypyrrole hydrogels as high-performance, flexible supercapacitor electrodes, Journal of Materials Chemistry A 2(17) (2014) 6086-6091.

[42] Z. Y. Liu, Z. S. Wu, S. Yang, R. H. Dong, X. L. Feng, K. Mullen, Ultraflexible In-Plane Micro-Supercapacitors by Direct Printing of Solution-Processable Electrochemically Exfoliated Graphene, Advanced Materials 28(11) (2016) 2217-2222.

[43] K. Yang, K. Cho, D. S. Yoon, S. Kim, Bendable solid-state supercapacitors with Au nanoparticle-embedded graphene hydrogel films, Scientific Reports 7 (2017).

[44] Y. X. Xu, Z. Y. Lin, X. Q. Huang, Y. Liu, Y. Huang, X. F. Duan, Flexible Solid-State Supercapacitors Based on Three-Dimensional Graphene Hydrogel Films, Acs Nano 7(5) (2013) 4042-4049.

[45] C. C. Wan, Y. Jiao, J. Li, Flexible, highly conductive, and free-standing reduced graphene oxide/polypyrrole/cellulose hybrid papers for supercapacitor electrodes, Journal of Materials Chemistry A 5(8) (2017) 3819-3831.

[46] H. Jung, C. V. Cheah, N. Jeong, J. Lee, Direct printing and reduction of graphite oxide for flexible supercapacitors, Applied Physics Letters 105(5) (2014).

[47] G. A. Snook, P. Kao, A. S. Best, Conducting-polymer-based supercapacitor devices and electrodes, Journal of Power Sources 196(1) (2011) 1-12.

While the invention has been described in terms of preferred embodiments, those skilled in the art will recognize that the invention can be practiced with modification within the spirit and scope of the appended claims.

The invention claimed is:

1. A supercapacitor, comprising
a flexible protein substrate,
at least two electrodes comprising a biocompatible conductive ink patterned on the flexible protein substrate, and
a biocompatible gel electrolyte connecting the at least two electrodes, wherein each of the flexible protein substrate, the at least two electrodes, and the gel electrolyte are biodegradable.

2. The supercapacitor of claim 1, wherein the flexible protein substrate is a silk protein substrate.

3. The supercapacitor of claim 2, wherein the silk protein substrate is fabricated from at least one of fibroin and sericin proteins.

4. The supercapacitor of claim 1, wherein the biocompatible gel electrolyte is NaCl-agarose.

5. The supercapacitor of claim 1, wherein the biocompatible conductive ink comprises sericin protein photoresist (SPP) and poly(3,4-ethylenedioxythiophene):polystyrene sulfonate (PEDOT:PSS).

6. The supercapacitor of claim 1, wherein the conductive ink is dosed with reduced graphene oxide (rGO).

7. The supercapacitor of claim 1, wherein patterning of said biocompatible conductive ink is performed using photolithography.

8. The supercapacitor of claim 1, wherein each of the flexible protein substrate, the at least two electrodes, and the gel electrolyte are configured to be biologically disintegrated within one month.

9. The supercapacitor of claim 1, wherein the flexible substrate has a Young's modulus of less than or equal to 2 MPa.

10. A biocompatible conductive ink comprising SPP, PEDOT:PSS, and rGO.

11. The biocompatible conductive ink of claim 10, wherein the concentration of PEDOT:PSS is 15-20 w/w %.

12. A method for fabricating a biodegradable supercapacitor, comprising the steps of:
    patterning electrodes on a flexible protein substrate with a biocompatible conductive ink, and
    interconnecting the electrodes with a biocompatible gel electrolyte.

13. The method of claim 12, wherein the flexible protein substrate is a silk protein substrate.

14. The method of claim 13, wherein the silk protein substrate is fabricated from at least one of fibroin and sericin proteins.

15. The method of claim 12, wherein the conductive ink comprises SPP and PEDOT:PSS.

16. The method of claim 15, wherein the conductive ink is dosed with rGO in the forming step.

17. The method of claim 12, wherein the biocompatible gel electrolyte is NaCl-agarose.

18. The method of claim 12, wherein said patterning step is performed using photolithography.

19. The method of claim 12, wherein said method is a water-based process carried out at room temperature.

20. The method of claim 12, further comprising a step of preparing the flexible protein substrate.

21. The method of claim 12, further comprising a step of forming the biocompatible conductive ink.

* * * * *